(12) United States Patent
Bogan et al.

(10) Patent No.: US 8,611,636 B1
(45) Date of Patent: *Dec. 17, 2013

(54) HIGH SPEED METHOD OF ALIGNING COMPONENTS HAVING A PLURALITY OF NON-UNIFORMLY SPACED FEATURES

(75) Inventors: Nathaniel Bogan, Natick, MA (US); Xiaoguang Wang, Alpharetta, GA (US)

(73) Assignee: Cognex Corporation, Natick, MA (US)

(*) Notice: Subject to any disclaimer, the term of this patent is extended or adjusted under 35 U.S.C. 154(b) by 812 days.

This patent is subject to a terminal disclaimer.

(21) Appl. No.: 12/319,284

(22) Filed: Jan. 5, 2009

(51) Int. Cl.
    *G06K 9/00* (2006.01)
(52) U.S. Cl.
    USPC .......................... 382/141; 382/150
(58) Field of Classification Search
    USPC .................. 382/141–149, 151
    See application file for complete search history.

(56) References Cited

U.S. PATENT DOCUMENTS

| | | |
|---|---|---|
| 5,446,960 A | 9/1995 | Isaacs et al. |
| 5,465,152 A | 11/1995 | Bilodeau et al. |
| 5,621,530 A | 4/1997 | Marrable, Jr. |
| 5,642,261 A | 6/1997 | Bond et al. |
| 5,652,658 A | 7/1997 | Jackson et al. |
| 5,669,545 A | 9/1997 | Pham et al. |
| 5,710,063 A | 1/1998 | Forehand et al. |
| 5,753,904 A | 5/1998 | Gil et al. |
| 5,768,759 A | 6/1998 | Hudson |
| 5,796,590 A | 8/1998 | Klein |
| 5,978,502 A | 11/1999 | Ohashi |
| 5,983,477 A | 11/1999 | Jacks et al. |
| 6,119,927 A | 9/2000 | Ramos et al. |
| 6,129,259 A | 10/2000 | Stansbury |
| 6,151,406 A | 11/2000 | Chang et al. |
| 6,173,070 B1 | 1/2001 | Michael et al. |
| 6,177,682 B1 | 1/2001 | Bartulovic et al. |
| 6,196,439 B1 | 3/2001 | Mays et al. |
| 6,278,193 B1 | 8/2001 | Coico et al. |
| 6,525,331 B1 | 2/2003 | Ngoi et al. |
| 6,956,963 B2 | 10/2005 | Ulrich et al. |
| 6,963,143 B2 | 11/2005 | Howarth |
| 7,005,754 B2 | 2/2006 | Howarth |
| 7,117,469 B1 | 10/2006 | Dahl |
| 7,129,146 B2 | 10/2006 | Hsu |
| 7,139,421 B1 | 11/2006 | Fix et al. |
| 7,141,450 B2 | 11/2006 | Pardo |
| 7,340,076 B2 | 3/2008 | Stach et al. |

(Continued)

OTHER PUBLICATIONS

Lowe, David G., "Distinctive Image Features from Scale-Invariant Keypoints", International Journal of Computer Vision, Jan. 2004, pp. 1-28.

(Continued)

*Primary Examiner* — Kara E Geisel
(74) *Attorney, Agent, or Firm* — Quarles & Brady LLP (57) ABSTRACT

A system and method for high-speed alignment of components is provided. During training time of a machine vision system, a small subset of alignment significant blobs along with a quantum of geometric analysis for picking granularity is determined. By utilizing only the alignment significant blobs and the geometric analysis, the use of conventional alignment techniques may achieve significantly better speed and robustness for component alignment. In operation, during training time, grayscale blobs are extracted using a scale space search. Alignment significant blobs are then determined from the grayscale blobs. Once alignment significant blobs are determined, run time smoothing and down sampling are then determined on the alignment significant blobs. The machine vision system is then trained to operate with the alignment significant regions.

23 Claims, 6 Drawing Sheets

(56) References Cited

U.S. PATENT DOCUMENTS

| | | | |
|---|---|---|---|
| 7,847,938 B2* | 12/2010 | Dohse | 356/400 |
| 2002/0093812 A1* | 7/2002 | Kiest et al. | 362/33 |
| 2002/0100955 A1 | 8/2002 | Potter | |
| 2003/0094707 A1 | 5/2003 | Howarth | |
| 2004/0120571 A1 | 6/2004 | Duvdevani et al. | |
| 2008/0095465 A1* | 4/2008 | Mullick et al. | 382/284 |
| 2010/0067780 A1* | 3/2010 | Kawaragi | 382/149 |
| 2010/0104216 A1* | 4/2010 | Ge et al. | 382/284 |
| 2010/0177191 A1* | 7/2010 | Stier | 348/92 |

OTHER PUBLICATIONS

Wu, Wen-Yen "A System for Automated BGA Inspection", Proceedings of the 2004 IEEE, Conference on Cybernetics and Intelligent Systems, Singapore Dec. 1-3, 2004.

* cited by examiner

HIGH SPEED METHOD OF ALIGNING COMPONENTS HAVING A PLURALITY OF NON-UNIFORMLY SPACED FEATURES

FIELD OF THE INVENTION

The present invention relates to machine vision systems and, more specifically, to aligning components having a plurality of non-uniformly spaced features using a machine vision system.

BACKGROUND OF THE INVENTION

The use of advanced machine vision systems and their underlying software is increasingly employed in a variety of manufacturing and quality control processes. Machine vision enables quicker, more accurate and repeatable results to be obtained in the production of both mass-produced and custom products. Basic machine vision systems include one or more cameras (typically having solid-state charge couple device (CCD) imaging elements) directed at an area of interest, frame grabber/image processing elements that capture and transmit CCD images, a computer and display for running the machine vision software application and manipulating the captured images, and appropriate illumination on the area of interest.

Many applications of machine vision involve the inspection of components and surfaces for defects that affect quality. Where sufficiently serious defects are noted, a part of a surface is marked as unacceptable/defective. Machine vision has also been employed in varying degrees to assist in manipulating manufacturing engines in the performance of specific tasks. Specifically, machine vision systems may be utilized for inspection of components along an assembly line to ensure that the components meet a predefined criteria before insertion and/or assembling of the components into a finished product.

Machine vision systems are typically utilized in alignment and inspection of components having a ball grid array (BGA) and/or flip chip form factor. BGA/flip chip components typically include a plurality of small solder balls on a mounting side of the component. The solder balls may then be soldered using ultrasound technology once a component is appropriately placed on a circuit board. Over the past few years, the number of balls on a flip chip have dramatically increased so that current flip chip components may have on the order of 12,000 balls. Furthermore, modern flip chip components typically have the solder balls less aligned on a grid pattern, i.e., the solder balls are non-uniformly spaced on the component.

Both of these trends complicate current machine vision systems that are utilized for alignment of flip chip designs. As the number of balls grows very large, current methods that rely on extracting balls or otherwise measuring ball features typically execute at a speed that is insufficient for run time. Furthermore, as the patterns of balls become more complex, search-based approach to alignments may enter worst-case scenarios. This may occur because a small misalignment in the translation or the angle may mean that a majority of individual features match thereby increasing the probability of an incorrect match occurring. Furthermore, flip chips often have strong body features present in an image obtained of the component. The body feature is typically not precisely aligned with the solder ball pattern, which means that these features must not be used for alignment. However existing machine vision tools are likely to use the strong body feature for alignment rather than the ball features, thereby resulting in unsatisfactory accuracy of alignment.

Additionally, conventional machine vision systems utilized for flip chips typically require geometric descriptions. However, a noted disadvantage since of such geometric descriptions is that they are extremely slow to train the geometric description when a flip chip has a non-repetitive pattern and/or a very large number of balls. As noted above, current trends in flip chip designs are increasing the number of balls and moving to non-repetitive, that is non-grid like patterns. As such, conventional machine vision systems for alignment of flip chips are becoming progressively slower as the current trends in design of flip chips continue.

SUMMARY OF THE INVENTION

The present invention overcomes the disadvantages of the prior art by providing a system and method for high-speed alignment of components having a plurality of non-uniformly spaced features. In accordance with an illustrative embodiment of the present invention, during training time of a machine vision system, a small subset of alignment significant blobs along with a quantum of geometric analysis for picking granularity is determined. By utilizing only the alignment significant blobs and the geometric analysis, the use of conventional alignment techniques may achieve significantly better speed and robustness for component alignment. In operation, during training time, grayscale blobs are extracted using a scale space search. Alignment significant blobs are then determined from the grayscale blobs. Once alignment significant blobs are determined, run time smoothing and down sampling are then determined on the alignment significant blobs. The machine vision system is then trained to operate with the alignment significant regions.

In operation during run-time, an image is captured of the component which is then smoothed and down sampled using the previously defined values. A coarse alignment is then performed before a fine alignment is performed. The fine alignment information is an output from the vision software. The coarse and fine alignments only utilize the previously identified alignment significant blobs, thereby providing higher speed and accuracy of alignment of the component.

BRIEF DESCRIPTION OF THE DRAWINGS

The above and further advantages of the invention may be better understood by referring to the following description in conjunction with the accompanying drawings in which like reference numerals indicate identical or functionally similar elements.

DETAILED DESCRIPTION OF AN ILLUSTRATIVE EMBODIMENT

A. Machine Vision System

Figure 1:
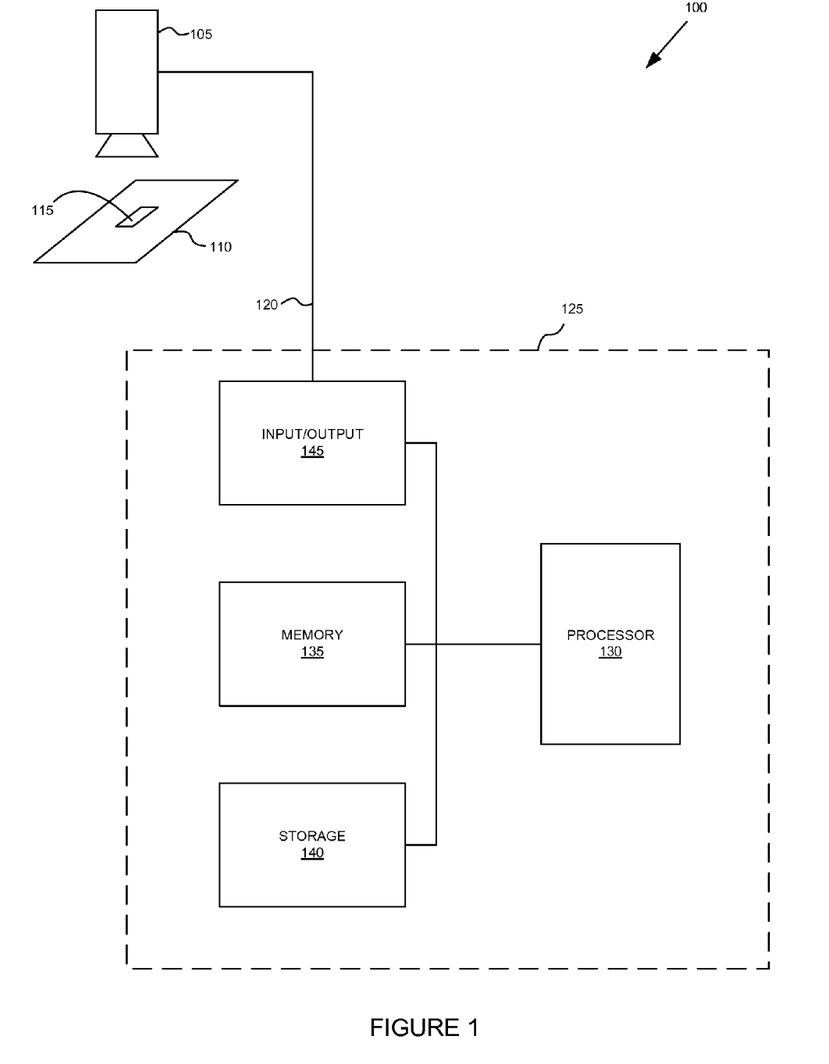
FIG. 1 is a schematic block diagram of an exemplary machine vision system in accordance with an illustrative embodiment of the present invention.

FIG. 1 is a schematic block diagram of a machine vision system 100 that may be utilized to practice the principles of the present invention in accordance with an illustrative embodiment of the present invention. The machine vision system 100 includes a capturing device 105 that generates an image of a field of view 110 that includes one or more object 115, such as a flip chip or other component. The capturing device 105 may comprise a conventional video camera or scanner. Such a video camera may be a charge coupled device (CCD) or other system for obtaining appropriate image information, such as the well-known CMOS sensors. Image data (or pixels) generated by the capturing device 105 represents an image intensity, for example, color or brightness of each point in the scene within the resolution of the capturing device 105. The capturing device 105 transmits a digital image data via a communications path 120 to an image analysis system 125. The image analysis system 125 may comprise a conventional digital data processor, such as the vision processing systems of the type commercially available from, for example, Cognex Corporation. The image analysis system 125 may comprise a conventional microcomputer or other exemplary computing device. Other forms of interfaces may be utilized, including, e.g., personal digital assistants (PDAs), etc. In alternative embodiments, the capturing device may include processing capabilities to perform the functions of the image analysis system. In such embodiments, there is not a need for a separate image analysis system. In further alternative embodiments, a capturing device may be operatively interconnected with an image analysis system for training purposes. Once training has occurred, an appropriate model or models may be stored in the capturing device for use during run time.

The image analysis system 125 is illustratively programmed in accordance with the teachings of the present invention provides for high speed alignment of components by utilizing detection of alignment significant blobs in accordance with an illustrative embodiment of the present invention. The image analysis system 125 may have one or more central processing units (processors) 130, main memory 135, input/output systems 145 and one or more disk drives or other form of mass storage 140. Illustratively, the input/output system 145 interconnects with the communications path 120 between the capturing device 105 and the image analysis system 125. The system 125 may be configured by programming instructions in accordance with the teachings of the present invention to perform the novel multi-image trained pattern recognition and registration of the present invention. As will be appreciated by those skilled in the art, alternative hardware and/or software configurations may be utilized to implement the principles of the present invention. Specifically, the teachings of the present invention may be implemented in software, hardware, firmware and/or any combination thereof. Furthermore, during run-time, as opposed to training time, additional components may be included in the machine vision system 100. For example, objects 115 may be transported by a conveyor belt (not shown) or other assembly line apparatus, etc.

In accordance with an illustrative embodiment of the present invention, the machine vision system 100 may be utilized to generate the training model for a run-time machine vision system. Thus, the machine vision system 100 may be utilized to generate a training model that may be utilized in a plurality of machine vision systems utilizing similar components.

It should be noted that while the present invention is described in terms of a machine vision system 100, the principles of the present invention may be utilized in a variety of differing embodiments. As such, the term machine vision system should be taken to include alternative systems. More generally, the principles of the present invention may be implemented on any system that aligns components. For example, one embodiment may involve a conventional machine vision system comprising of a stand alone camera operatively interconnected with a stand alone computer programmed to process images, etc.

However, the principles of the present invention may be utilized in other devices and/or systems that align components based on images acquired of the component. For example, a vision sensor, such as the Checker product available from Cognex Corporation, or other device that comprises illumination sources, image acquisition capabilities and/or processing capabilities. Such vision sensors may be trained and/or configured via separate modules, such as a Cognex VisionView. In such embodiments, the user may train the vision sensor using a plurality of objects, instead of a single object. The user may select a first object, place it in front of the sensor and indicate to the system that the training object is positioned. A second (third, etc.) object may be similarly trained. The user may control the training step using, e.g., a graphical user interface (GUI) and/or buttons or other control surfaces located on either the training module and/or the vision sensor itself. Furthermore, the functionality of the present invention may be incorporated into handheld devices, wireless compatible devices, etc. As such, the term machine vision system should be interpreted broadly to encompass all such systems and devices that may utilize one or more of the teachings of the present invention.

B. Components Having Non-Uniformly Spaced Features

Figure 2:
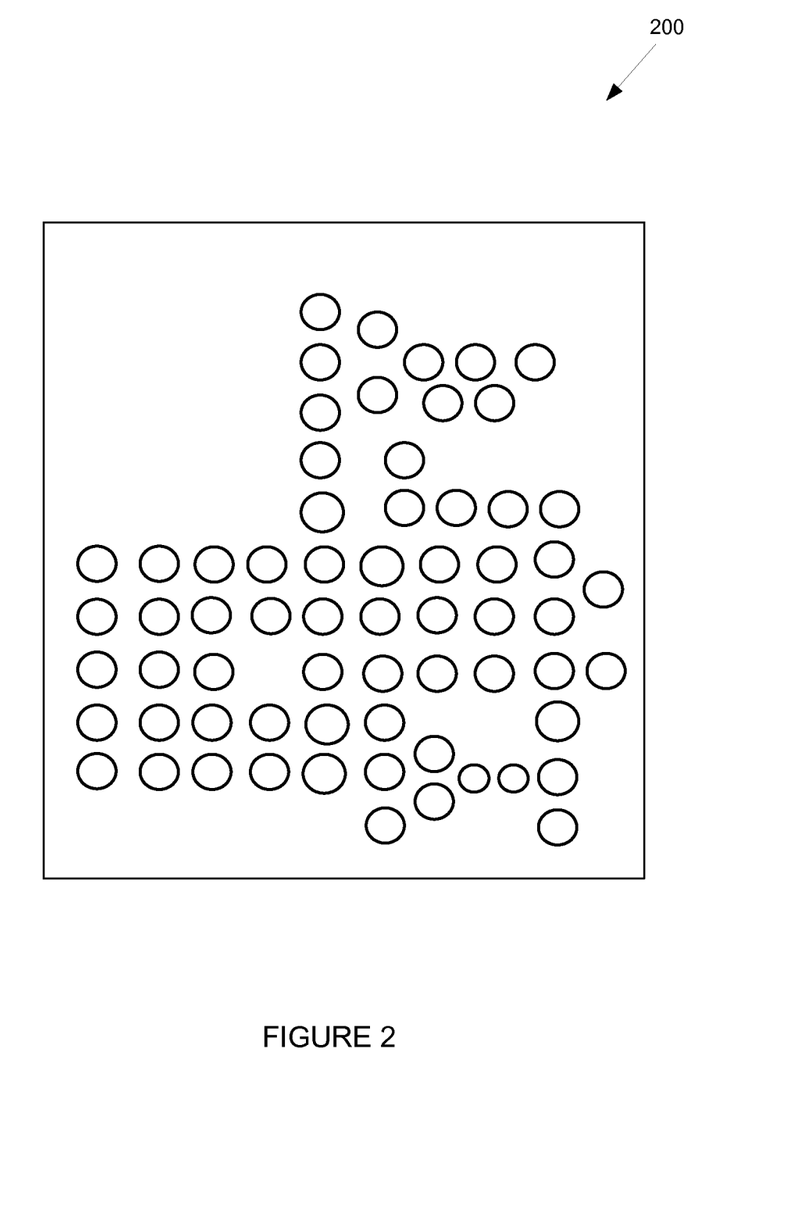
FIG. 2 is a schematic block diagram of a portion of a solder ball pattern of an exemplary component in accordance with an illustrative embodiment of the present invention.

FIG. 2 is a schematic diagram of an exemplary component 200 in accordance with an illustrative embodiment of the present invention. It should be noted that in illustrative embodiments of the present invention, a component may have on the order of tens of thousands of balls. Thus, the schematic diagram of the component 200 should be taken as exemplary only. It should further be noted that on exemplary component 200, a number of the solder balls are laid out on a grid pattern. However, it is expressly contemplated that in alternative embodiments of the present invention, the balls may be laid out in a non-grid or other non-uniform pattern. As such, the description of component 200 should not be taken to limit the invention to grid-aligned ball patterns.

In illustrative embodiments of the present invention, the size, shape, orientation of regions lacking balls on a component may vary dramatically. Component 200 should be taken as an exemplary component for purposes of illustrating the principles of the present invention. However, as will be appreciated by one skilled in the art, the principles of the present invention may be utilized with components having any number of regions of missing and/or varying balls including those component that utilize non-uniform ball densities, i.e., non-grid aligned solder ball patterns.

Figure 3:
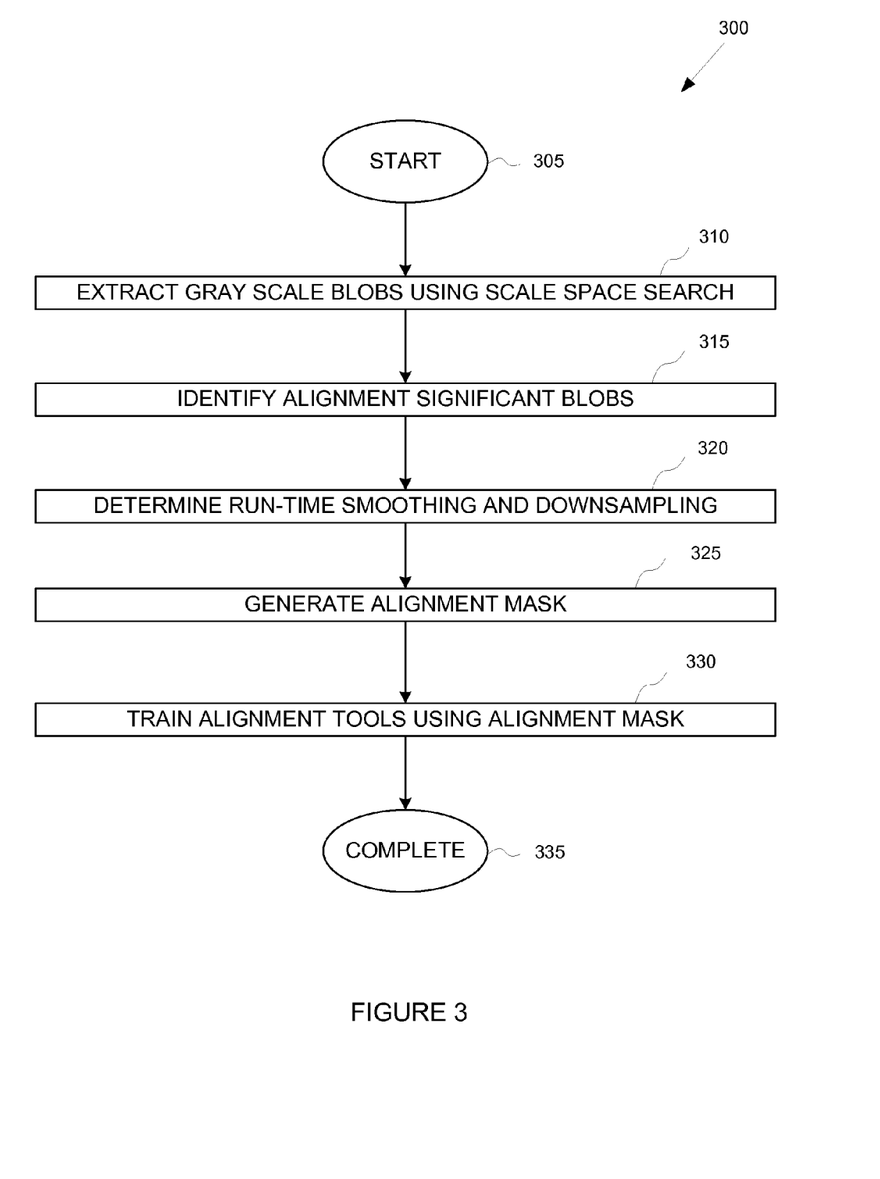
FIG. 3 is a flow chart detailing the steps of a procedure for training a machine vision system in accordance with an illustrative embodiment of the present invention.

FIG. 3 is a flow chart detailing the steps of a procedure 300 for performing training of a machine vision system in accordance with an illustrative embodiment of the present invention. The procedure 300 begins in step 305 and continues to step 310 where grayscale blobs are extracted from an image using a scale space search. An illustrative scale space search that may be utilized in an illustrative embodiment of the present invention is described in *Distinctive Image Features from Scale-Invariant Keypoints*, by David G. Lowe, the contents of which are hereby incorporated by reference.

Once grayscale blobs have been extracted, the machine vision system then identifies alignment significant blobs in step 315. Alignment significant blobs are those blobs that cannot be easily mistaken for their neighbors when a pattern is shifted in various directions. More generally, blobs that are on boundaries of dense regions are typically alignment significant. One technique for determining alignment significance is described below. However, it should be noted that alternative techniques for determining alignment significance may be utilized in alternative embodiments of the present invention. As such, the alignment significance determination technique described herein should be taken as exemplary only.

For the purposes of an illustrative embodiment of an alignment significance determination, an immediate neighbor of a blob is defined to be those neighbors within a predefined constant factor of a given blob's nearest neighbor distance. In an illustrative embodiment, the predefined constant factor is 1.5. Thus, those blobs within it 1.5 units of is a given blob's nearest neighbor are defined to be the blob's immediate neighbors. A blob is then defined as alignment significant if a sufficiently large angle exists in which there are no immediate neighbors.

Figure 4:
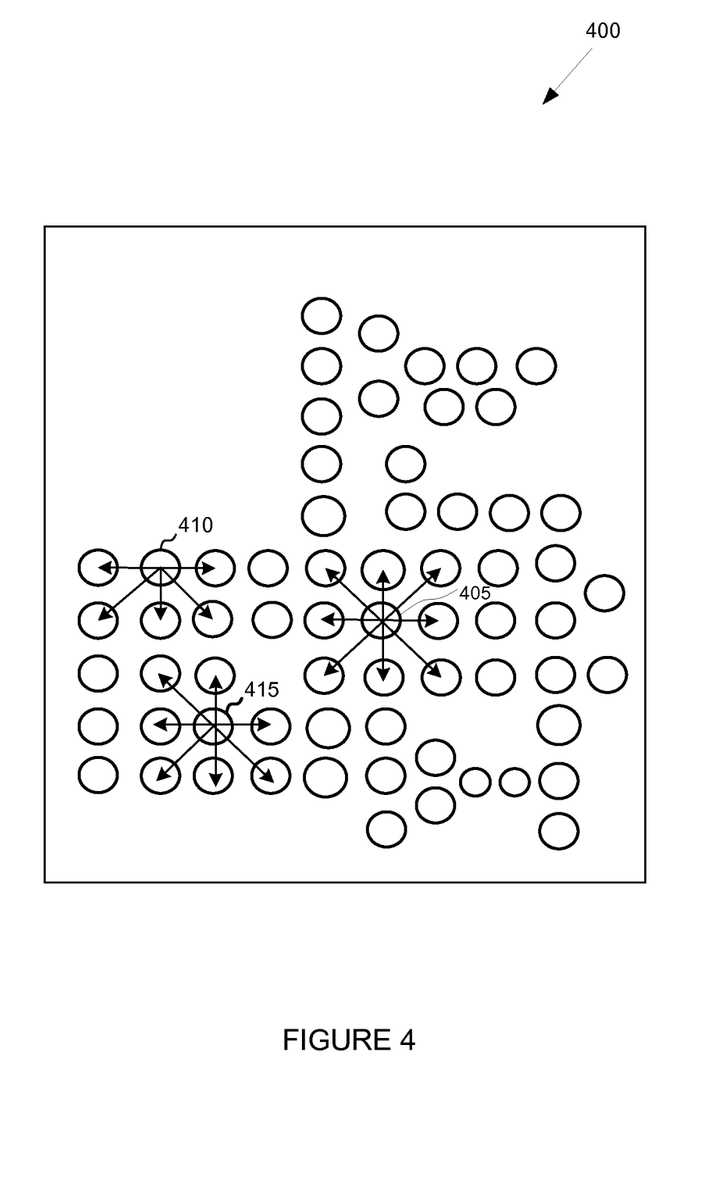
FIG. 4 is a schematic block diagram of a portion of a solder ball pattern of an exemplary component showing determinations of alignment significant blobs in accordance with an illustrative embodiment of the present invention.

FIG. 4 is a schematic block diagram of an exemplary component 400 in accordance with an illustrative embodiment of the present invention. Illustratively, component 400 contains the same pattern of balls as exemplary component 200 of FIG. 2. In an illustrative embodiment, a predefined angle of 135° is utilized to determine alignment significance. However, in alternative embodiments, any angle may be utilized as a threshold angle for determining alignment significance. As such, the description of the use of 135° angle should be taken as exemplary only.

Thus, in accordance with step 315 of procedure 300, each blob in illustrative component 400 is examined for alignment significance. Exemplary blob 405 is examined; however, as blob 405 is on the interior of a conventional checkerboard pattern, the largest angle range that is empty is approximately 45°. Therefore, blob 405 is deemed to not be alignment significant. Next, blob 410 is examined and it is determined that the angle in which there are no neighbors is approximately 180°. As this is greater than the exemplary 135° threshold, blob 410 is deemed to be alignment significant. Finally, blob 415 is examined. As the largest angle without neighbors is approximately 90°, which is less than 135°, blob 415 is also deemed to not be alignment significant.

Figure 5:
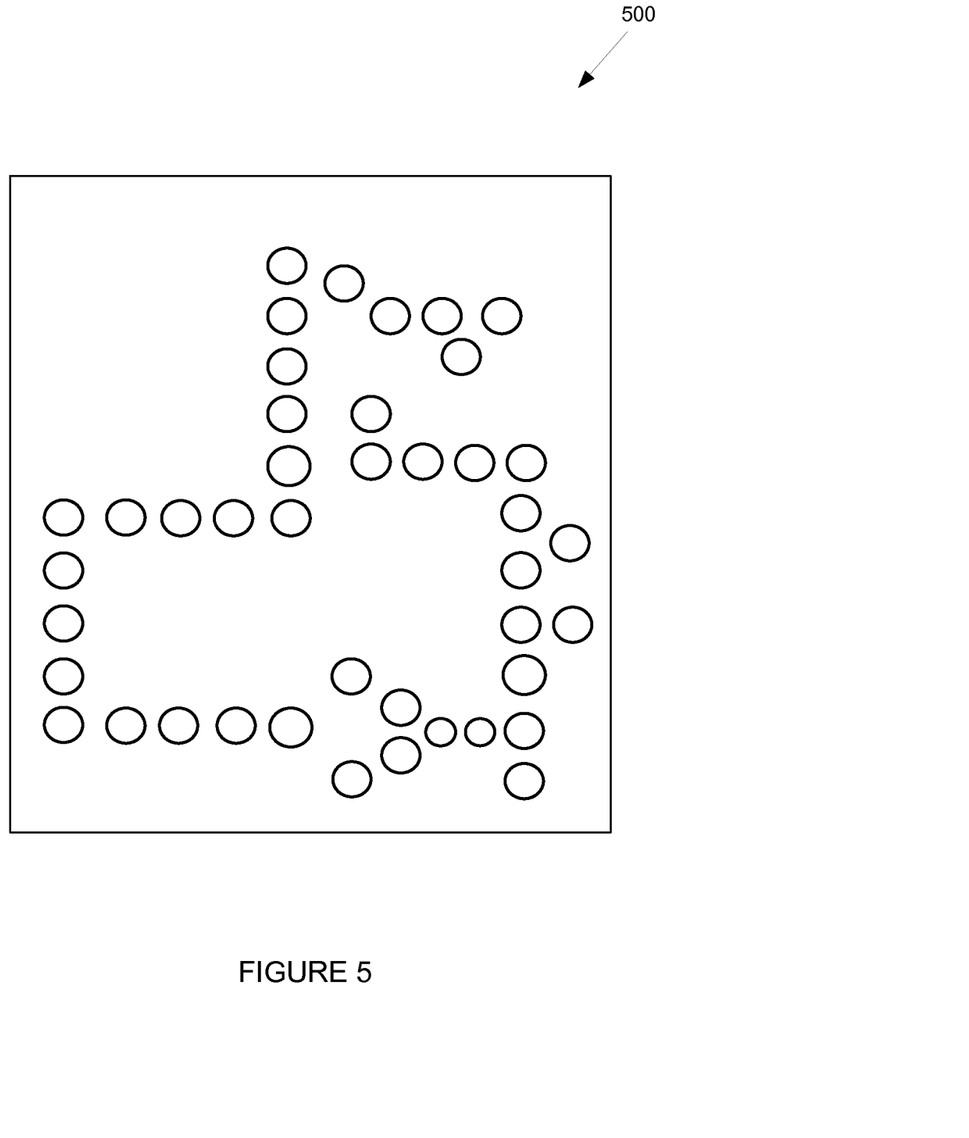
FIG. 5 is a schematic block diagram of a portion of a solder ball pattern of an exemplary component showing alignment significant blobs in accordance with an illustrative embodiment of the present invention.

FIG. 5 is a schematic diagram illustrating the alignment significant blobs from component 400. Illustratively, only those blobs that meet the 135° threshold level are shown in FIG. 5.

Returning to procedure 300, in step 320, the machine vision system determines appropriate run time smoothing and down sampling for the image. Smoothing is performed to enable search methods to be robust by ensuring that a reasonable match score is attained. In step 325, an alignment mask is generated that only includes those alignment significant blobs. Illustratively, a plurality of alignment masks may be generated with differing masks being specific to certain alignment tools and/or techniques. Once the alignment mask is generated, the generated mask is utilized to train one or more alignment tools in step 330. Such alignment tools may include, e.g., normalized correlation tools, edgelet based tools, etc.

The procedure 300 then completes in step 335. Illustratively, procedure 300 works to train a machine vision system by focusing only on alignment significant regions of a component. This reduces the complexity and increases the speed at which components can be aligned during run time.

Figure 6:
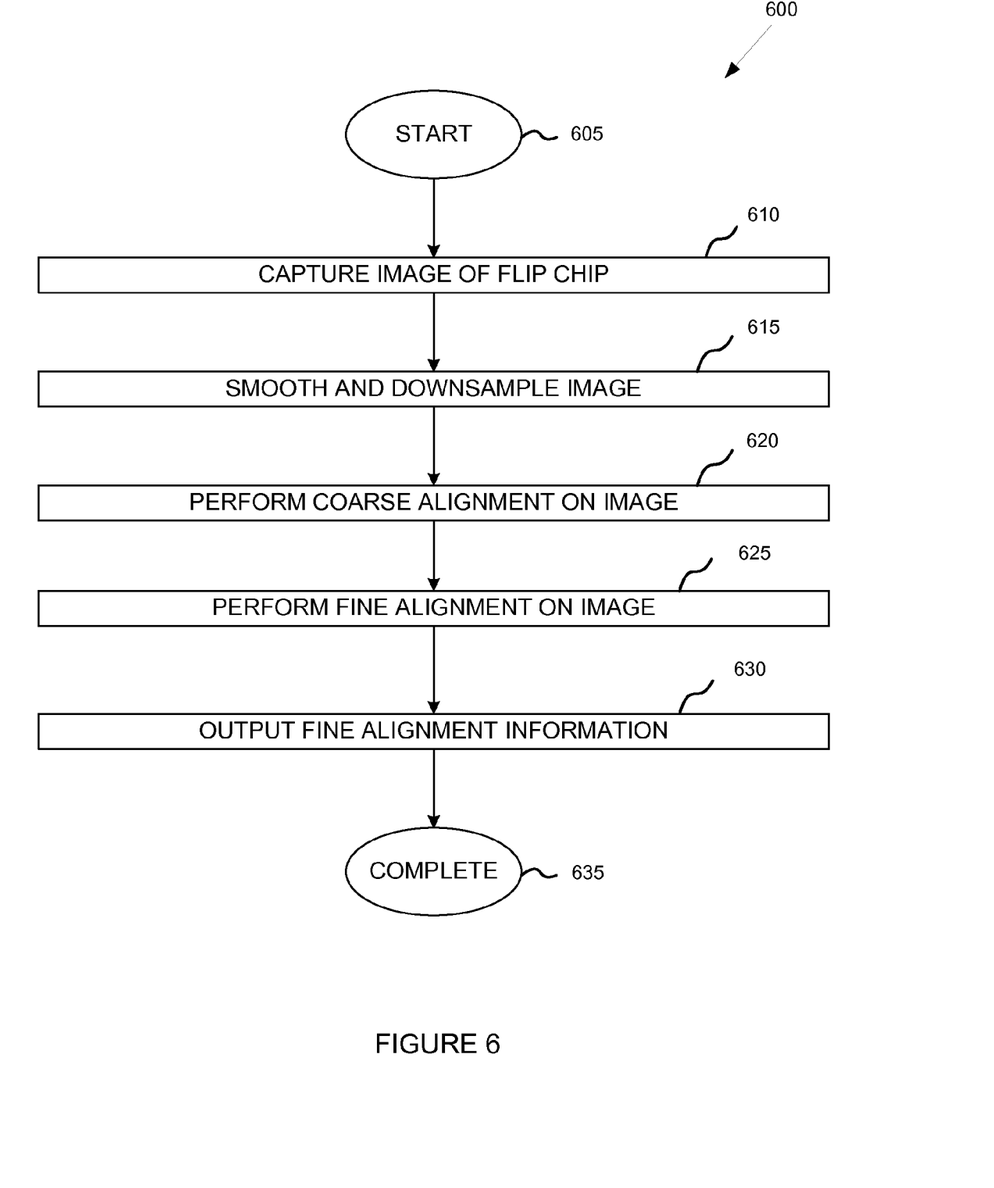
FIG. 6 is a flow chart detailing the steps of a procedure for performing run time alignment of components in accordance with an illustrative embodiment of the present invention.

FIG. 6 is a flowchart detailing the steps of a procedure 600 for high-speed alignment of components during run time in accordance with an illustrative embodiment of the present invention. The procedure 600 begins in step 605 and continues to step 610 where an image is captured of the component. Illustratively, the image is captured using the capturing device 105. The captured image is then smoothed and down sampled in step 615. Illustratively, this smoothing and down sampling occurs using the values defined during training time. In an illustrative embodiment of the present invention, smoothing is based on the median nearest-neighbor distance of the extracted blobs.

A coarse alignment is performed of the image in step 620. A fine alignment of the image is then performed in step 625. The coarse and fine alignment steps 620, 625 may be combined into a single alignment step in alternative embodiments of the present invention. The coarse and fine alignment steps 620,625 are illustratively implemented using conventional machine vision techniques with only the alignment significant regions masked in. This enables the alignment techniques to operate at sufficient speed to meet production requirements and to provide the necessary degree of accuracy. The fine alignment information is then output in step 630. The fine alignment information that is output may be used by, e.g., a robotic actuator (not shown) to properly align the flip chip prior to it being soldered in place. It should be noted that in an illustrative embodiment of the present invention, the coarse alignment step 620 is performed using a normalized correlation technique, while the fine alignment step 625 utilizes an edglet-based matching technique. As such, the description of the coarse and fine alignment steps using the same technique should be taken as exemplary only. The procedure 600 then completes in step 635.

The foregoing description has been directed to particular embodiments of this invention. It will be apparent, however, that other variations and modifications may be made to the described embodiments, with the attainment of some or all of their advantages. Additionally, the procedures, processes and/or modules described herein may be implemented in hardware, software, embodied as a computer-readable medium having program instructions, firmware, or a combination thereof. Therefore, it is the object of the appended claims to cover all such variations and modifications as come within the true spirit and scope of the invention.

What is claimed is:

1. A method for aligning a component, the method comprising:
   extracting one or more blobs from an image of the component;
   identifying one or more alignment significant blobs; and
   generating an alignment mask using the alignment significant blobs.

2. The method of claim 1 further comprising training a machine vision system to operate utilizing the generated alignment mask.

3. The method of claim 1 wherein extraction of blobs further comprises performing a scale space search on the image.

4. The method of claim 1 wherein the component comprises a flip chip component.

5. The method of claim 1 wherein performing the generated alignment mask is utilized for a normalized correlation search.

6. The method of claim 1 wherein identifying alignment significant blobs further comprises identifying a set of blobs that have no neighboring blobs within a predefined threshold angle.

7. The method of claim 6 wherein neighboring blobs comprise a set of blobs that are located within a predefined distance from a given blob.

8. The method of claim 1 wherein the blobs are representative of solder balls that are non-uniformly aligned on the component.

9. The method of claim 1 wherein the extract blobs comprise gray scale blobs.

10. A system for aligning a component, the system comprising:
- an image capture device configured to obtain an image of the component;
- a processor configured to (i) extract a set of gray scale blobs from the obtained image of the component and (ii) identify a set of alignment significant blobs from the set of extracted gray scale blobs;
- wherein the processor is further configured to determine an amount of smoothing to be performed on the obtained image of the component.

11. The system of claim 10 wherein the processor is further configured to perform a normalized correlation search on the set of alignment significant blobs using a first granularity.

12. The system of claim 11 wherein the processor is further configured to perform a normalized correlation search on the set of alignment significant blobs using a second granularity.

13. The system of claim 10 wherein the component comprises a flip chip.

14. The system of claim 13 wherein the flip chip has a plurality of solder balls that are non-uniformly spaced.

15. A method for aligning a component having a plurality of non-uniformly spaced features, the method comprising:
- obtaining an image of the component;
- extracting a set of gray scale blobs from the obtained image, wherein the gray scale blobs are extracted using a scale space search;
- identifying a set of alignment significant blobs from the set of extracted gray scale blobs; and
- performing an alignment technique using a first granularity.

16. The method of claim 15 further comprising performing a second alignment technique using a second granularity.

17. The method of claim 15 further comprising training a machine vision system to align the component using a set of alignment significant regions.

18. A non-transitory computer readable medium for aligning a component, the computer readable medium including program instructions for executing on a processor, the program instructions comprising instructions for:
- extracting one or more blobs from an image of the component;
- identifying one or more alignment significant blobs;
- generating an alignment mask using the alignment significant blobs.

19. The non-transitory computer readable medium of claim 18 wherein extraction of blobs further comprises performing a scale space search on the image.

20. The method of claim 10 wherein the processor is further configured to perform a coarse normalized correlation search on the set of alignment significant blobs.

21. The method of claim 20 wherein the processor is further configured to perform a fine normalized correlation search on the set of alignment significant blobs after the coarse normalized correlation search is completed.

22. A method for aligning a component having a plurality of non-uniformly spaced features, the method comprising:
- obtaining an image of the component;
- extracting a set of gray scale blobs from the obtained image, wherein the gray scale blobs are extracted using a scale space search;
- identifying a set of alignment significant blobs from the set of extracted gray scale blobs; and
- performing a coarse alignment technique.

23. The method of claim 22 further comprising performing a fine alignment technique in addition to the coarse alignment technique.

* * * * *